United States Patent [19]

Rose et al.

[11] 4,131,982
[45] Jan. 2, 1979

[54] MATRIX PIN ASSEMBLY TOOL

[75] Inventors: William H. Rose; Richard F. Granitz, both of Harrisburg, Pa.

[73] Assignee: AMP Incorporated, Harrisburg, Pa.

[21] Appl. No.: 846,244

[22] Filed: Oct. 27, 1977

[51] Int. Cl.² .............................................. H05K 3/30
[52] U.S. Cl. ................................. 29/566.2; 29/626; 29/628; 29/739; 29/758; 29/764; 145/46; 339/276 SF
[58] Field of Search .................. 29/739, 741, 758, 764, 29/566.2, 564.6, 626, 628; 227/149; 339/276 SF; 145/46, 30 R

[56] References Cited

U.S. PATENT DOCUMENTS

| | | | |
|---|---|---|---|
| 979,953 | 12/1910 | Holmes et al. | 145/30 R |
| 3,136,040 | 6/1964 | Bauer et al. | 29/739 |
| 3,177,952 | 4/1965 | West | 29/739 X |

*Primary Examiner*—Carl E. Hall
*Attorney, Agent, or Firm*—Gerald K. Kita

[57] ABSTRACT

The disclosure relates to a tool for storing and assembling conductive contact elements into a miniature pin board, the tool including an elongate body having a lengthwise supply chamber communicating with open ends of the body. One open end is formed into a resiliently expansible throat which allows dispensing of individual contact elements. The opposite open end of the body is provided with resilient fingers having jaws which are biased toward each other to grip and remove a contact element from the pin board.

1 Claim, 5 Drawing Figures

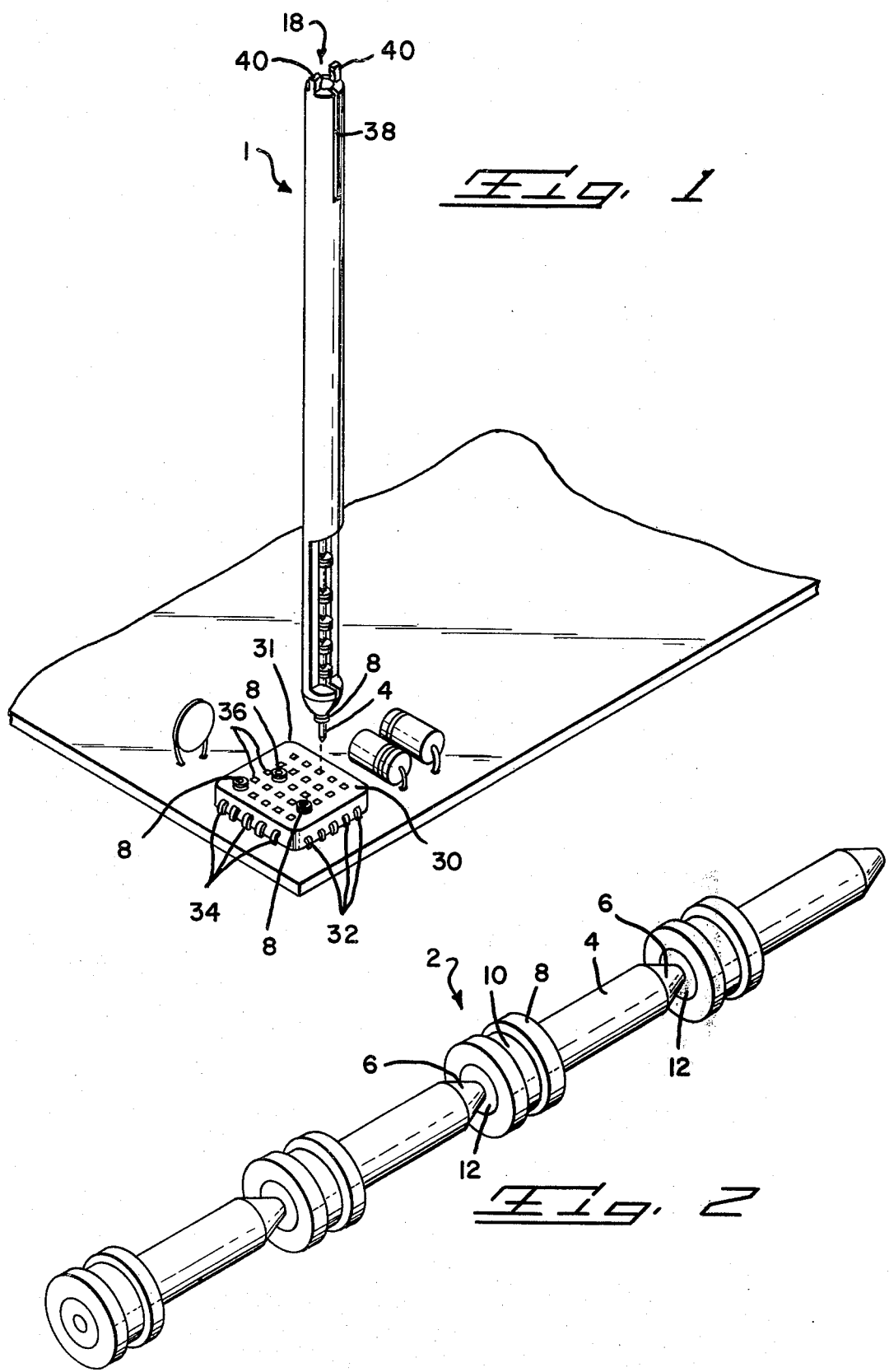

MATRIX PIN ASSEMBLY TOOL

BACKGROUND OF THE INVENTION

A miniature pin board assembly is provided with rows of elongate strip conductors over laid by a second row of strip conductors in spaced relationship from the conductors of the first row. An elastomeric such as silicone rubber is molded into a substrate into which the first and second rows are embedded. A matrix of openings are provided in the molded substrate to provide access to locations where the second row of conductors crosses over the first row. A conductive pin is selectively inserted into a corresponding opening to cross connect a conductor of a first row with a conductor of a second row. The elastomeric material resiliently grips the pin to retain the same and to apply pressure on the pin for forcible and continuous engagement with the cross connected conductors.

The matrix of openings in the substrate are grouped ten to an inch requiring miniaturized pins to accomplish the cross connects. Because of their small size and their relatively close spacing when inserted in the matrix, the pins are difficult to handle, both in assembly and removal thereof from the matrix. Accordingly, there exists a need for a tool for storing and dispensing the pins and for assembling the pins individually in the matrix. It is also desirable that the tool extract or remove a selected pin from the matrix.

BRIEF DESCRIPTION

In the present invention a tool comprises a generally thick walled tubular body having first and second open ends communicating with a central longitudinal bore or storage chamber of the body. A plurality of conductive contact elements, each provided with an enlarged head, are stored serially in the longitudinal bore. The contacts are frangibly secured together in serial fashion and are inserted through a first open end of the body and into the storage chamber. The second open end of the tool is provided with a plurality of longitudinal slots dividing the tubular body at that end into a plurality of spring fingers encircling the second open end. The fingers provide a resiliently expansible chuck with the second open end providing a resiliently expansible throat to allow outward passage of each contact element in turn from said storage chamber. A longitudinal section of the tubular body is removed to expose the serially fed conductive pins for manual advancement of the pins serially through the chuck. A foremost pin is dispensed outwardly of the chuck and is maintained in position thereat by virtue of being secured to the remainder of the conductive pins. The tool is used to forcibly insert the foremost pin into a selected matrix aperture. The tool then is pivoted back and forth to frangibly separate the foremost pin from the remainder of pins. In this manner the tool is used to store, dispense, and insert conductive pins of small size which normally are difficult to handle.

As a further feature the tool is provided with longitudinal slots communicating with the first open end of the tool and dividing this end of the tool into resilient cantilever fingers. Relatively thin jaws are provided at the ends of the fingers. By squeezing the fingers, the jaws will be urged toward each other. In this manner the jaws may grippingly engage an enlarged head of a pin to retract the same from the matrix. The removed pin may then be discarded or, alternatively, be reinserted into the matrix without removal thereof from the jaws.

It is therefore an object of the present invention to provide a hand tool for storing, dispensing, and assembling individual conducting pins individually into a matrix, the pins being of miniature size and therefore difficult to handle.

Another object of the present invention is to provide a hand tool for storing a serial array of frangibly connected pins of small size, and for staking individual ones of the pins into a miniature pin bore and for frangibly separating an inserted pin from the remainder of pins subsequent to assembly in the matrix.

Another object of the present invention is to provide a tool which stores and serially dispenses interconnected conducted pins individually through a resiliently expansible throat, the tool being manually operative for staking a dispensed pin into a miniature matrix and for frangibly separating an inserted pin from the remainder of pins, the tool further being provided with resilient jaws remote from the expansible throat for gripping and removing a selected pin from the matrix.

Other objects and attendant advantages will become apparent from the following detailed description taken in conjunction with the accompanying drawings.

BRIEF DESCRIPTION OF THE DRAWINGS

FIG. 1 is a fragmentary perspective illustrating a preferred embodiment of a tool according to the present invention prior to inserting, by staking, a conductive pin into a miniature pin board.

FIG. 2 is an enlarged perspective of a serial array of conductive pins frangibly connected in tandem.

DETAILED DESCRIPTION

Figures 3, 4, 5:
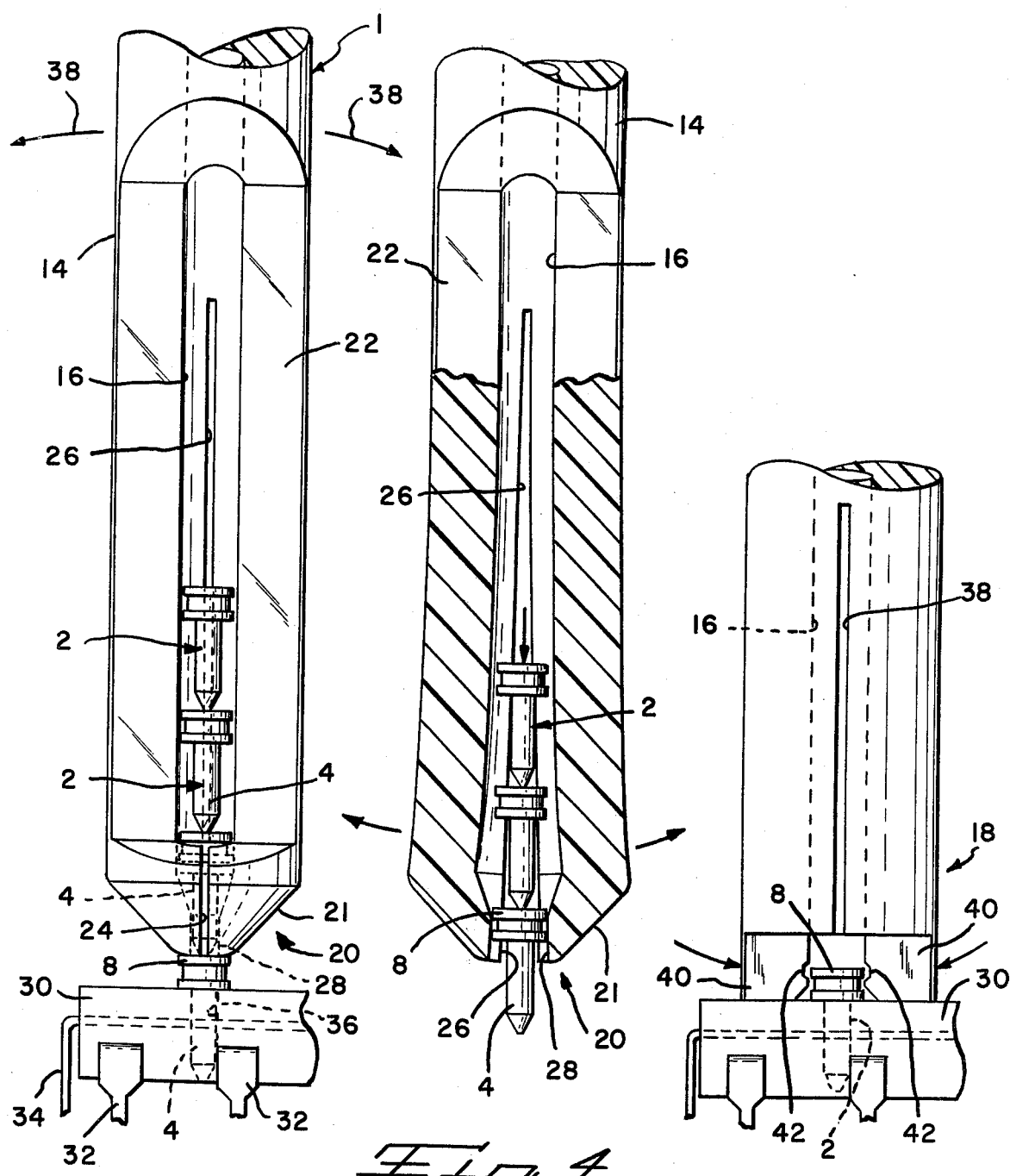
FIG. 3 is an enlarged fragmentary elevation illustrating a staking operation of the tool whereby a foremost conductive pin is inserted into a miniature pin board.
FIG. 4 is a fragmentary enlarged elevation partially in section of the tool shown in FIG. 1 illustrating a resiliently expansible chuck which allows individual dispensing of the conductive pins.
FIG. 5 is an enlarged fragmentary elevation illustrating resilient jaws at opposite ends of a tool for gripping an individual pin for removal thereof from the pin board.

With more particular reference to the drawings, there is illustrated generally at 1 in FIG. 1 a hand tool according to the present invention for handling miniature conductive elements, mainly, conductive contact pins of the type shown in FIG. 2 generally at 2. Each of the pins is provided with a cylindrical body 4 and a tapered tip 6 at one end thereof. The opposite end of the pin is provided with an enlarged cylindrical head 8 having a central circular groove 10. Each head 8 may be of conducting material, in which case it is integral with the body 4. Each head 8 alternatively may comprise a dielectric material which is molded in place over a pin body 4. In either case a serial array of conductive pins is provided by integrally joining a tapered tip 6 of one pin to a right cylindrical end 12 of a pin body 4 which is exposed although encircled by the enlarged head 8.

As shown more particularly in FIGS. 1, 3, and 4, the tool is provided with a generally thick walled tubular body 14 having a central bore therethrough 16 forming a magazine or storage chamber for a quantity of serially connected contact elements 2 as shown in FIG. 2. More particularly the chamber 16 communicates at one end thereof with a first open end 18 of the tool into which the array of contact pins 2 are initially inserted for storage in the chamber.

FIGS. 3 and 4 illustrate a second open end 20 of the tool. A longitudinal section 22 proximate the open end 20 of the tool is removed to expose some of the conductive pins in the chamber 16. The exposed pins can be manually urged toward the open end 20 of the tool for individual dispensing of the pins. More particularly, the open end 20 is encircled by a tapered end wall 21 of the tool which is provided with a first longitudinal slot 24 therein longitudinally of the body 14. Thus slot 24 communicates with the removed section 22 which terminates at the end wall 21. A second longitudinal slot 26 is provided through the end wall 21 and through a substantial length of the tool body 14. The two slots 24 and 26 divide the open end of the tool into two resilient finger portions which form a resiliently expansible chuck. The chuck portion of the tool is provided with a normally narrow throat or opening 28 which encircles a body portion 4 of a conductive pin. However, the throat 28 is enlarged upon deflection apart of the finger portions to allow a foremost pin through the throat opening 28. As more particularly shown in FIG. 4, manual pressure on the exposed pins 2 forces a foremost pin through the narrow throat opening 28. The fingers of the chuck are resiliently expanded by forcible passage therethrough of the enlarged head 8 of the foremost pin. Once the foremost pin is passed the opening 28, the chuck fingers or jaws will resiliently close, closely encircling the narrow body portion 4 of a pin which is immediately behind the foremost pin. Therefore a foremost pin in the array of pins stored in the chamber 16 is dispensed through the open end 20 of the tool and is maintained thereat for assembly by the tool into a pin board. Such a pin board as shown more particularly at 30 in FIG. 1 comprising a resilient dielectric matrix 31 in which are embedded a first row of elongated conductors 32 and a second row of elongated conductors 34 perpendicular to the first row. When a pin is inserted into one of the apertures 36 of the pin board 30 one of the conductors 32 will be cross connected by the inserted pin with one of the conductors 34. Normally the apertures 36 are arranged ten to the inch, requiring very small pins for pluggable connection therein. Due to the small size of the pins, handling thereof is very difficult.

The tool 1 according to the present invention stores and individually dispenses conducting pins 2 in the manner described. As shown in FIG. 3 taken in conjunction with FIG. 1 the tool 1 is used for staking a foremost pin into a selected aperture 36. The tapered end 21 of the tool engages against the enlarged head 8 of the foremost dispensed pin and applies pressure thereto for pressing the body 4 of the pin into a corresponding matrix aperture 36. After assembly of the foremost pin, the tool 1 is pivoted back and forth as shown by the arrows 38 until the foremost pin is frangibly separated from the remainder of pins still contained within the tool. By repeating the operations described the tool according to the present invention dispenses a plurality of pins, in turn. The tool additionally assembles the pins in turn to a miniature plug board and frangibly separates each inserted pin fron the remainder of pins contained by the tool.

In addition the tool is utilized to extract a pin from the matrix. Such a feature is illustrated more particularly in FIG. 5 taken in conjunction with FIG. 1. Shown in FIG. 5 the matrix 30 includes a pin 2 therein. The first end 18 of the tool is shown inverted in FIG. 5 and is provided with a pair of longitudinal slots 38, only one of which is shown, since the slots are aligned in the Figures. The slots 38 communicate with the open end 18 and with the internal bore or chamber 16. Accordingly the slots 38 divide this end of the tool into a pair of resiliently deflectable fingers. The cylindrical end of the tool is ground away, leaving a relatively thin web 40 at the terminal end of each finger. Each web 40 is provided with a small notch 42 facing an opposite web. As shown in FIG. 5 the webs 40 are used as gripping jaws to engage an enlarged head 8 of a conductive pin 2 in the matrix plug board 30. By resiliently squeezing the fingers toward each other the jaws 40 will be urged toward each other into gripped relationship on opposite sides of the enlarged head 8. The gripped pin 2 is removed or extracted from the pin board 30 by pulling the same using the tool. The removed pin may be discarded or alternatively inserted again into the matrix of apertures of the pin board 30 without removal from the jaws 40.

Although a preferred embodiment of the present invention is disclosed in detail other embodiments and modifications thereof which would be apparent to one having ordinary skill in the art are intended to be covered by the spirit and scope of the appended claims.

What is claimed is:

1. A tool for assembling conductive contact elements into a substrate having an array of contact receiving openings, comprising:
    an elongate body having first and second ends and containing an elongated supply chamber communicating with said first and second ends,
    a longitudinal section of said body being open and exposing portions of a plurality of frangibly connected contact elements for feeding along said chamber toward said first end,
    a resiliently expansible throat defined by said first end and being expansible upon forcible passage therethrough of an enlarged head of each contact element to allow passage of each contact element in turn from said chamber,
    pressure applying means at said first end for urging each contact element in turn into a selected contact receiving opening, and
    resilient jaws at said second end for gripping a selected contact for extraction of the same from a contact receiving opening.

* * * * *